United States Patent
Jeon et al.

(10) Patent No.: US 9,159,958 B2
(45) Date of Patent: Oct. 13, 2015

(54) ORGANIC LIGHT EMITTING DISPLAY DEVICE

(75) Inventors: Il Jeon, Seoul (KR); Jin-Ho Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 13/339,075

(22) Filed: Dec. 28, 2011

(65) Prior Publication Data

US 2012/0327336 A1    Dec. 27, 2012

(30) Foreign Application Priority Data

Jun. 22, 2011  (KR) .................. 10-2011-0060760
Nov. 11, 2011  (KR) .................. 10-2011-0117351

(51) Int. Cl.
| | |
|---|---|
| G02F 1/1335 | (2006.01) |
| H01L 51/52 | (2006.01) |
| G02B 5/30 | (2006.01) |
| H01L 27/32 | (2006.01) |

(52) U.S. Cl.
CPC .......... *H01L 51/5281* (2013.01); *G02B 5/3016* (2013.01); *H01L 27/3211* (2013.01)

(58) Field of Classification Search
CPC ............ H01L 51/5281; H01L 27/3211; G02B 5/3016
USPC .................... 349/69, 96, 102, 61, 98, 137
See application file for complete search history.

(56) References Cited

U.S. PATENT DOCUMENTS

| | | | | |
|---|---|---|---|---|
| 6,262,788 B1 * | 7/2001 | Hanrahan et al. | ............. | 349/117 |
| 6,420,001 B1 * | 7/2002 | Coates et al. | ................. | 428/1.1 |
| 2003/0002154 A1 * | 1/2003 | Trapani et al. | ................ | 359/492 |
| 2004/0090578 A1 | 5/2004 | Chang et al. | | |
| 2005/0035353 A1 | 2/2005 | Adachi et al. | | |
| 2007/0131928 A1 | 6/2007 | Kwak et al. | | |
| 2008/0174722 A1 * | 7/2008 | Ohyama et al. | .................. | 349/75 |
| 2009/0310068 A1 * | 12/2009 | Sakai | .............. | 349/96 |
| 2010/0165248 A1 * | 7/2010 | Ham et al. | ....................... | 349/64 |
| 2010/0252825 A1 * | 10/2010 | Yamazaki et al. | ............... | 257/40 |
| 2010/0301271 A1 * | 12/2010 | Adlem et al. | ............ | 252/299.62 |

FOREIGN PATENT DOCUMENTS

| | | |
|---|---|---|
| CN | 1499265 A | 5/2004 |
| CN | 1591101 A | 3/2005 |
| CN | 101769508 A | 7/2010 |

(Continued)

OTHER PUBLICATIONS

Office Action issued in corresponding Korean Patent Application No. 10-2011-0117351, mailed Sep. 21, 2012.

(Continued)

*Primary Examiner* — Nathanael R Briggs
(74) *Attorney, Agent, or Firm* — Brinks Gilson & Lione (57) ABSTRACT

Disclosed is an organic light emitting display device to prevent deterioration of visibility caused by reflection of incident light and color transition at high viewing angle, and improve transmittance, the organic light emitting display device includes an organic light emitting display panel, and an antireflective member adhered to an outer surface of the organic light emitting display panel, the antireflective member including a reactive liquid crystal layer and a polarizer film which are laminated in this order, wherein the reactive liquid crystal layer has a λ/4 retardation with respect to a transmitted light of the polarizer film.

12 Claims, 4 Drawing Sheets

(56) References Cited

FOREIGN PATENT DOCUMENTS

| | | |
|---|---|---|
| CN | 101796164 A | 8/2010 |
| CN | 102089334 A | 6/2011 |
| JP | 2008517322 A | 5/2008 |
| JP | 2010-161051 | 7/2010 |
| JP | 2010-170988 | 8/2010 |
| JP | 2010243769 A | 10/2010 |
| TW | 394852 B | 6/2000 |
| TW | 200922921 A | 6/2009 |
| TW | I320231 B | 2/2010 |
| TW | 201013239 A | 4/2010 |

OTHER PUBLICATIONS

Office Action issued in corresponding Chinese Patent Application No. 201110449978.2, mailed Jan. 6, 2014, 17 pages.

Office Action issued in Taiwanese Patent Application No. 100148010, mailed Jun. 12, 2014, 16 pages.

Office Action and Search Report issued in Chinese Patent Application No. 201110449978.2, mailed Feb. 28, 2015, 19 pages.

* cited by examiner

ORGANIC LIGHT EMITTING DISPLAY DEVICE

This application claims the benefit of Korean Patent Applications No. 10-2011-0060760, filed on Jun. 22, 2011 and No. 10-2011-0117351, filed on Nov. 11, 2011, which are hereby incorporated by reference as if fully set forth herein.

BACKGROUND

1. Field of the Disclosure

The present disclosure relates to an organic light emitting display device. More specifically, the present invention relates to an organic light emitting display device to prevent deterioration of visibility caused by reflection of incident light and color transition at high viewing angle.

2. Discussion of the Related Art

Image display devices to display a variety of information on the screen are developed toward the trends of thinness, light weight, portability and high performance as the core technologies of the info-communication age. Flexible displays are required in accordance with demand for spartial efficiency and convenience and organic light emitting display devices to control the amount of emitted light have thus recently attracted great attention as flat-panel displays.

An organic light emitting display device includes an organic light emitting display panel in which a first electrode, an organic light emitting layer and a second electrode are laminated in this order between an upper substrate and a lower substrate. An electric field forms between the first electrode and the second electrode at both ends of the organic light emitting layer, electrons and holes are injected and transported in the organic light emitting layer and the electrons and holes are then combined together. At this time, the binding energy therebetween causes emission of light, which is called an "electroluminescent phenomenon". The organic light emitting display device uses the electroluminescent phenomenon.

Such an organic light emitting display device does not require an additional light source, unlike a liquid crystal display device, and is lightweight and thin, as compared to the liquid crystal display device. In addition, the organic light emitting display device attracts much attention as a next-generation display device due to high qualities such as low power consumption, high brightness and high response speed.

Meanwhile, the organic light emitting display device is classified into a top emission type and a bottom emission type depending on the light emission direction. The bottom emission-type has superior safety and process variability, but is unsuitable for application to high-resolution products due to limited aperture ratio. Accordingly, recently, a great deal of research associated with a top emission-type organic light emitting display device having a high aperture ratio and a high resolution is underway.

However, the organic light emitting display device exhibits a great decrease in contrast according to the intensity of exterior light. Accordingly, the organic light emitting display device prevents deterioration in contrast caused by exterior light through an organic light emitting display panel provided with an antireflective layer and thereby improves visibility.

Figure 1:
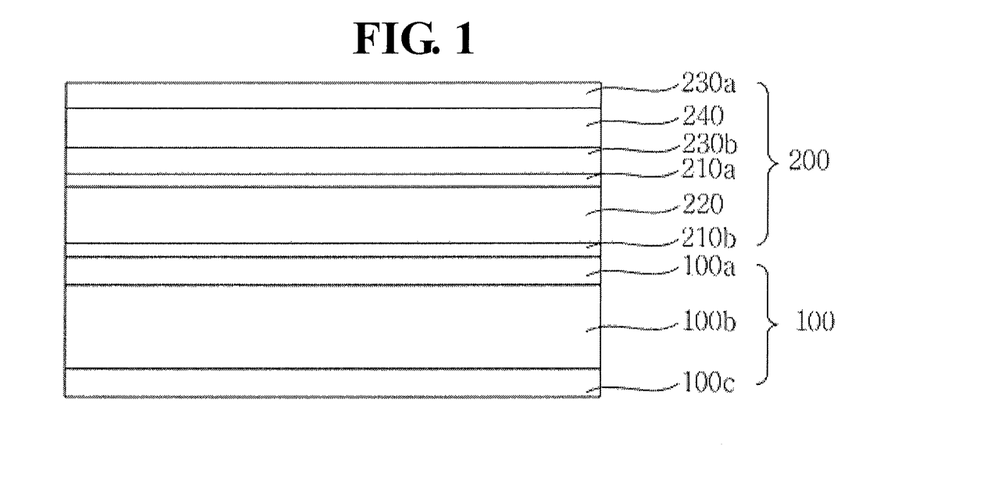
FIG. 1 is a sectional view illustrating an organic light emitting display device in the related art.
Figure 2:
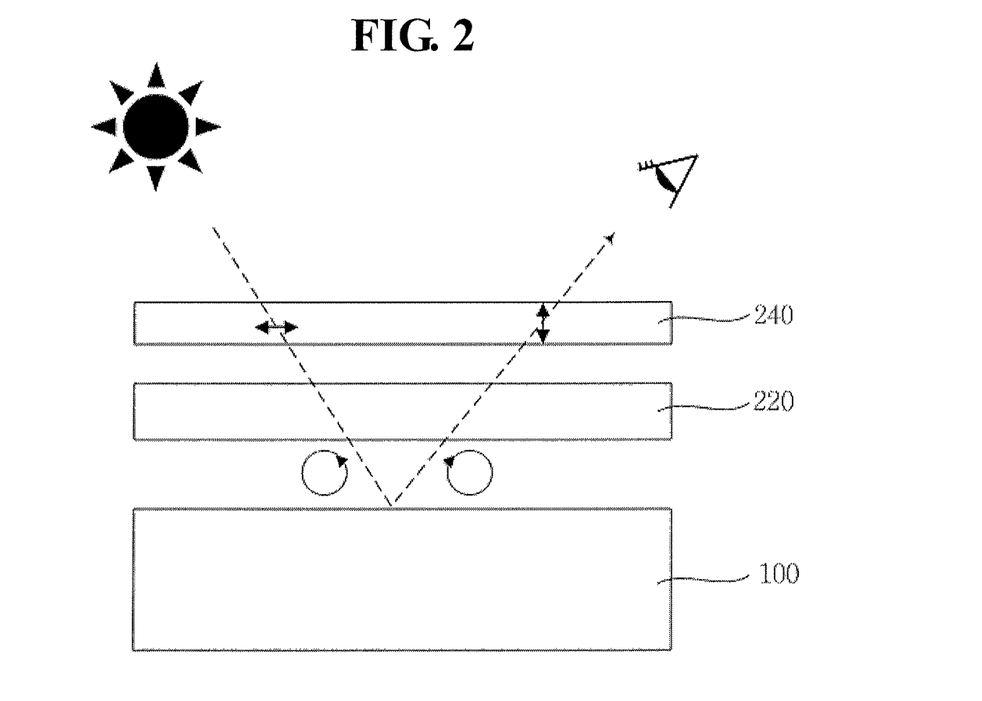
FIG. 2 is a sectional view illustrating a passage of exterior light incident upon the organic light emitting display device.
Figure 3:
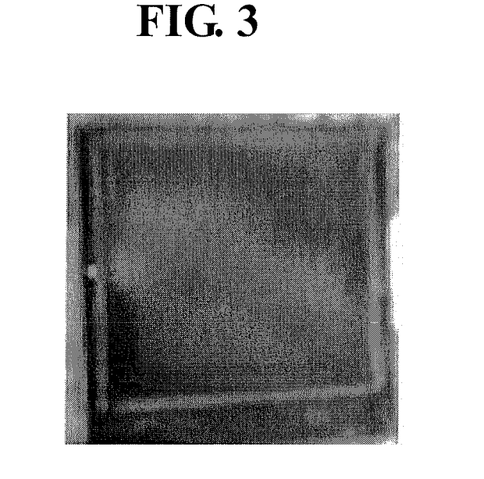
FIG. 3 is an image showing screen defects of the organic light emitting display device.

FIG. 1 is a sectional view illustrating an organic light emitting display device in a related art and FIG. 2 is a sectional view illustrating a passage of exterior light incident upon the organic light emitting display device. FIG. 3 is an image showing screen defects of the organic light emitting display device.

As shown in FIG. 1, the organic light emitting display device in the related art includes an organic light emitting display panel 100 and an antireflective member 200 formed on the organic light emitting display panel 100, the organic light emitting display panel 100 including an upper substrate and a lower substrate 100a and 100c, and an organic light emitting layer 100b formed between the upper and lower substrates 100a and 100c.

The antireflective member 200 includes a retardation film (hereinafter, also referred to as a "quarter wave plate", QWP, 220) and a polarizer film 240 formed on the quarter wave plate 220 to prevent reflection and emission of exterior light incident upon the organic light emitting display device. The polarizer film 240 has a transmission axis, and transmits linear polarized light parallel to the transmission axis, but absorbs light non-parallel to the transmission axis, among exterior light incident upon the polarizer film 240.

In addition, the quarter wave plate ($\lambda/4$ plate) 220 changes the polarization state of light and has an optical axis inclined at about ±45° with the transmission axis of the polarizer film 240. The quarter wave plate 220 changes light, which is linearly polarized, while passing through the polarizer film 240, into circularly polarized light, or changes circularly polarized light into linearly polarized light.

Upper and lower protective layers 230a and 230b are adhered to the top and the bottom of the polarizer film 240, respectively, to support and protect the polarizer film 240. In addition, the quarter wave plate 220 is adhered to the organic light emitting display panel 100 through the lower adhesive layer 210b and the lower protective layer 230b is adhered to the quarter wave plate 220 through the upper adhesive layer 210a.

Specifically, as shown in FIG. 2, exterior light is incident through the polarizer film 240. At this time, the polarizer film 240 transmits exterior light parallel to the transmission axis and absorbs exterior light non-parallel to the transmission axis. Accordingly, exterior light is linearly polarized in the transmission axis direction. Then, linearly polarized exterior light passes through the quarter wave plate 220 and is circularly polarized such that the vibrational direction thereof circularly moves.

In addition, circularly polarized exterior light is reflected from the surface of the organic light emitting display panel 100 and the rotation direction of exterior light is then reversed. Then, the light passes through the quarter wave plate 220 and is then linearly polarized. At this time, since the polarization surface of the light, which passes through the quarter wave plate 220 and is then linearly polarized, is perpendicular to the polarization surface of the linearly polarized light which does not pass through the quarter wave plate 220, exterior light which is linearly polarized again forms an angle of 90° with the transmission axis of the polarizer film 240. Accordingly, the exterior light does not pass through the polarizer film 240 and is absorbed and blocked by the polarizer film 240. That is, light incident upon the organic light emitting display device is not discharged to the outside.

However, in the organic light emitting display device of the related art, the antireflective member 200 adhered to the top of the organic light emitting display panel 100 has a large thickness of over 200 μm since the quarter wave plate 220 are adhered to the organic light emitting display panel and the lower protective layer 230b by using adhesive layers on both surfaces of the quarter wave plate 220. Thus it makes difficult to realize slimness of the organic light emitting display device.

Also, since exterior light having the overall visible ray range of wavelengths, rather than a single wavelength, is incident upon the organic light emitting display device, light transmittance on the quarter wave plate 220 is varied depending on the wavelength range. For this reason, conversion of linearly polarized light into circularly polarized light or circularly polarized light into linearly polarized light is incomplete. In addition, the lower protective layer 230b between the polarizer film 240 and the quarter wave plate 220 also exhibits retardation and transmittance of exterior light which is emitted outside is thus varied depending on the wavelength range. As shown in FIG. 3, screen defects of the organic light emitting display device occur.

That is, in the organic light emitting display device in the related art, the lower protective layer 240b has retardation and transmittance is varied at respective wavelength ranges due to wavelength dispersibility of the quarter wave plate 220. In particular, transmittance is high at red and blue wavelength ranges and violet color is realized rather than black color, when red and blue light transmit to a black mode organic light emitting display device.

SUMMARY

An organic light emitting display device includes: an organic light emitting display panel; and an antireflective member adhered to an outer surface of the organic light emitting display panel, the antireflective member including a reactive liquid crystal layer and a polarizer film which are laminated in this order, wherein the reactive liquid crystal layer has a λ/4 retardation with respect to a transmitted light of the polarizer film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE EXEMPLARY EMBODIMENTS

The organic light emitting display device of the present invention will be more clearly understood from the following detailed description taken in conjunction with the accompanying drawings.

Figure 4:
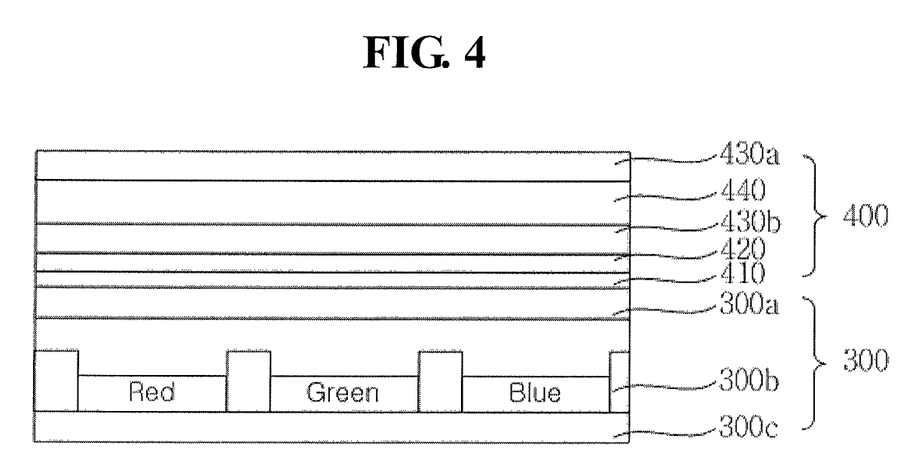
FIG. 4 is a sectional view illustrating an organic light emitting display device of the present invention according to a first embodiment.
Figure 5:
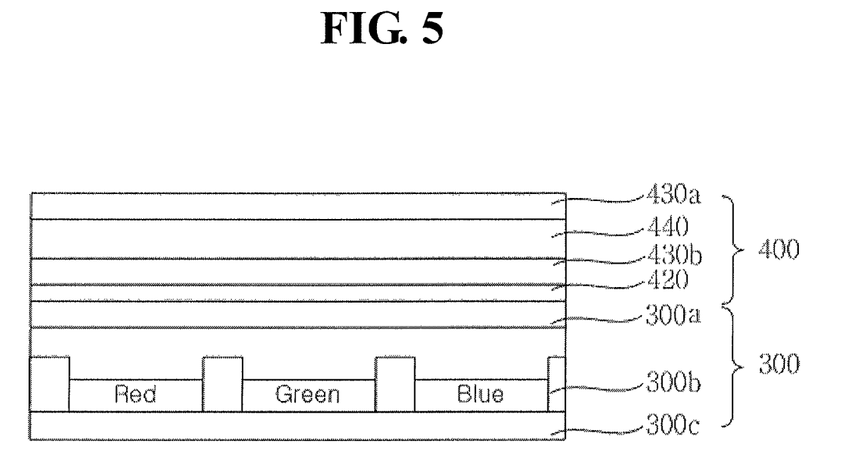
FIG. 5 is a sectional view illustrating an organic light emitting display device of the present invention according to a second embodiment.
Figure 6A:
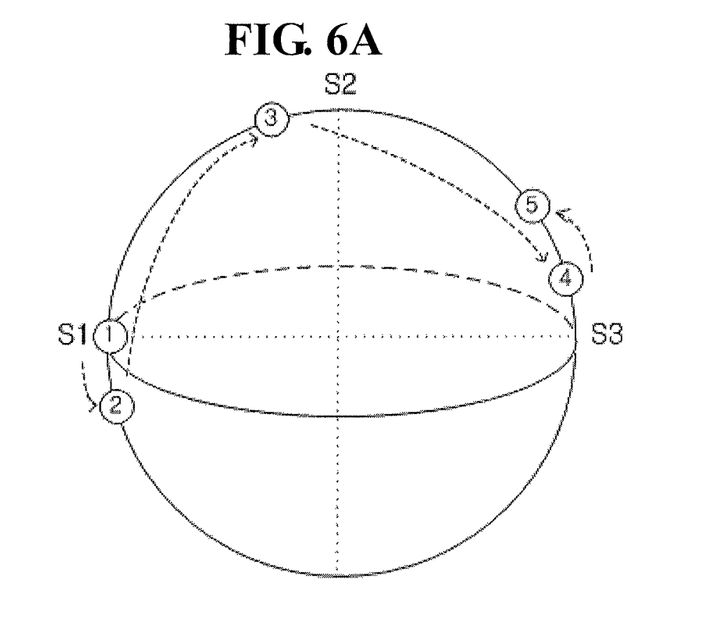
FIGS. 6A and 6B are sectional views illustrating a passage of exterior light on a Poincaré sphere in the organic light emitting display device of the related art and the organic light emitting display device of the present invention, respectively.
Figure 6B:
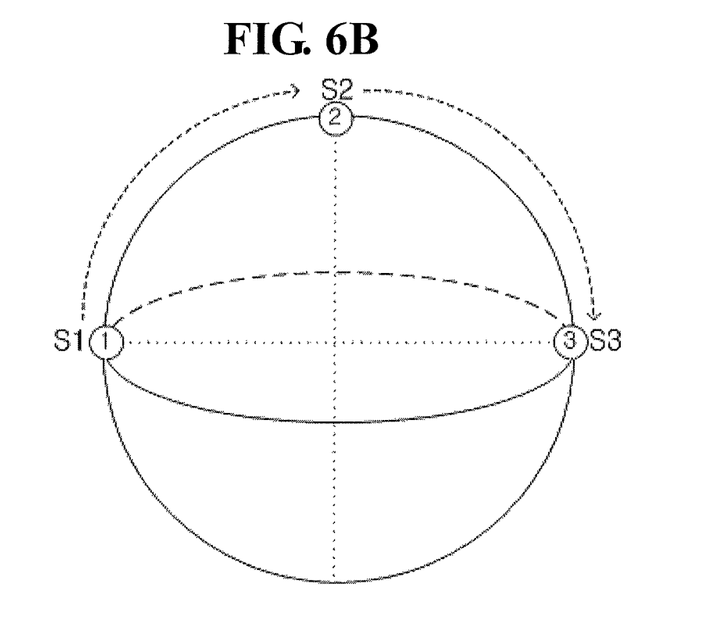

FIG. 4 is a sectional view illustrating an organic light emitting display device of the present invention according to a first embodiment. FIG. 5 is a sectional view illustrating an organic light emitting display device of the present invention according to a second embodiment. FIGS. 6A and 6B are sectional views illustrating a passage of exterior light on a Poincaré sphere in the organic light emitting display device of the related art and the organic light emitting display device of the present invention, respectively.

Referring to FIG. 4, the organic light emitting display device of the present invention according to a first embodiment includes an organic light emitting display panel 300, and an antireflective member 400 adhered to the organic light emitting display panel 300 to prevent reflection and emission of exterior light incident upon the organic light emitting display device.

The organic light emitting display panel 300 includes a plurality of sub pixels arranged in the form of a matrix between an upper substrate 300a and a lower substrate 300c. At this time, a bank 300b is formed between the sub pixels and respective sub pixels are separated based on the bank 300b. In addition, respective sub pixels use additional organic materials to emit red (R), green (G) and blue (B) light.

The upper and lower substrates 300a and 300c of the organic light emitting display panel 300 are transparent substrates. Although not illustrated, the lower substrate 300c includes a cell operation member including a plurality of signal lines and a plurality of thin film transistors and a protective layer, and the upper substrate 300a is a substrate for encapsulation.

The cell operation member includes a transistor for switching, a transistor for operation and a storage capacitor. The transistor for switching supplies data signals from the data lines in response to scanning signals of the gate lines, the transistor for operation controls current amount which passes through the organic light emitting display device through a connection electrode in response to data signals from the transistor for switching.

In addition, the storage capacitor allows a predetermined current to flow through the transistor for operation although the transistor for switching is turned off. The transistor for operation is electrically connected to the organic light emitting display panel 300 through the connection electrode.

The organic light emitting layer is a layer to emit light, when holes and electrons injected from a first electrode and a second electrode, respectively, are combined together to form exitons and the excitons then drop to a ground state. A hole transfer layer is formed between the first electrode and the organic light emitting layer. A hole injection layer to facilitate injection of holes into the organic light emitting layer may be further formed between the first electrode and the hole transfer layer. In addition, an electron transport layer is formed between the organic light emitting layer and the second electrode. An electron injection layer to facilitate injection of electrons to the organic light emitting layer may be further formed.

Herein, a unit from the first electrode to the second electrode may be called to an "OLED" (organic light emitting diode) and the cell operation member and the OLED is formed on the lower substrates 300c in a matrix.

In addition, the organic light emitting display device exhibits a great decrease in contrast according to the intensity of exterior light. Accordingly, the organic light emitting display device includes the antireflective member 400 on the organic light emitting display panel 300 to prevent deterioration in contrast caused by exterior light, thus improving visibility.

The antireflective member of the organic light emitting display device of the related art includes a polarizer film and a retardation film. The polarizer film transmits exterior light parallel to the transmission axis of the polarizer film and absorbs exterior light non-parallel to the transmission axis of the polarizer film. In addition, the retardation film converts linearly polarized light into circularly polarized light, or converts circularly polarized light into linearly polarized light.

In this regard, as mentioned above, in the organic light emitting display device of the related art, the lower protective layer of the polarizer film has retardation value and so that transmission ratio of the emmisive light from the organic light emitting display device are different according to wavelength. In this case, among exterior light which passes through the quarter wave plate, light which does not satisfy optimal requirements of the quarter wave plate (retardation film) and light which is emitted from the organic light emitting layer to the outside, may undergo color transition at a high viewing angle region.

In the organic light emitting display device of the related art, the antireflective member adhered to the top of the organic light emitting display panel has a large thickness of over 200 μm since the quarter wave plate are disposed between the organic light emitting display panel and the lower protective layer by using adhesive layers on both surfaces of the quarter wave plate. Thus it makes difficult to realize slimness of the organic light emitting device. Further, as the antireflective member becomes thicker, visible viewing angle region becomes narrower when applying the organic light emitting display device as 3D display using a Film type patterned retarder.

Accordingly, the organic light emitting display device of the present invention includes the reactive liquid crystal layer 420 instead of the quarter wave plate on the organic light emitting display panel 300 and uses an NRT layer 430b without retardation value below the polarization layer 440.

Herein, the antireflective member is specifically described.

The antireflective member 400 includes a polarizing layer 440, a protective layer 430a adhered to the top of the polarizing layer 440, an NRT (non-retardation triacetyl cellulose (TAC)) layer 430b and an organic light emitting display panel 300 adhered to the bottom of the polarizing layer 440, and a reactive mesogen (RM) layer 420 provided under the NRT layer 430b, the reactive liquid crystal layer having a retardation of λ/4 with respect to a transmitted light of the polarizing layer 440.

An optical axis of the reactive liquid crystal layer have an angle of about +45° or −45° with respect to a transmission axis of the polarizing layer 440. In addition, although not illustrated, the reactive liquid crystal layer 420 includes an alignment layer and reactive liquid crystal coated on the alignment layer. In example, the alignment layer is made of polyimide and the reactive liquid crystal is reactive mesogen.

Herein, the polarizaing layer 440, a protective layer 430a, and an NRT (non-retardation triacetyl cellulose (TAC)) layer 430b are called to a polarizer film as a unit.

A polarizing layer 440 is adhered to the top of the reactive liquid crystal layer 420 to convert exterior light incident upon the organic light emitting display device into linearly polarized light. The polarizing layer 440 is preferably made of polyvinyl alcohol (PVA) and the polarizer film 400 transmits exterior light parallel to the transmission axis and absorbs exterior light non-parallel to the transmission axis.

A protective layer 430a and an NRT layer 430b are adhered to the top and bottom of the polarizing layer 440 to physically support and protect the polarizing layer 440. The protective layer 430a adhered to the polarizing layer 440 is made of an acetate resin such as triacetyl cellulose (TAC), a polyester resin, a polycarbonate resin, a polyamide resin, a polyimide resin, a polyolefin resin, an acrylic resin or the like.

In particular, the protective layer 430a is preferably made of a transparent and strong material, since the polarizing layer 440 has a small thickness and a low strength. The protective layer 430a is preferably a triacetyl cellulose (TAC) film, which is saponified with an alkali in view of improvement in polarization characteristics or durability.

In a case where the protective layer 430a is a triacetyl cellulose film, an additional adhesive layer to adhere the protective layer 430a to the polarizing layer 440 is unnecessary. In addition, the NRT (non-retardation TAC) film 430b is adhered to the bottom of the polarizing layer 440. The reactive liquid crystal layer 420 is on an outer surface of the NRT layer 430b. The NRT layer 430b is a triacetyl cellulose film, which does no exhibit retardation.

In the organic light emitting display device of the related art, when exterior light, which passes through the polarizer film and is converted into linearly polarized light, it exhibits variation in transmittance at different wavelengths due to retardation of the lower protective layer, while passing through the lower protective layer and thus causes color transition.

However, in the organic light emitting display device of the present invention, the NRT layer 430b arranged under the polarizing layer 440 serves as a protective layer and thus prevents color transition. In this case, the reactive liquid crystal layer 420 may be directly coated on the NRT layer 430b without any adhesive. In this case, processing of roll to roll is possible since an optical axis of the reactive liquid crystal layer is defined after coating on the NRT layer 430b.

In particular, the organic light emitting display device using the NRT layer 430b exhibits improvement in side visibility and permeability and thus optical performance. In addition, in some cases, the NRT layer 430b may be adhered to the top and the bottom of the polarizing layer 440.

The reactive liquid crystal layer 420 is adhered to the upper substrate 300a of the organic light emitting display panel 300 through an adhesive layer 410.

At this time, the adhesive layer 410 is made of a commonly used adhesive resin, which does not limit transmittance of light. Examples of the adhesive resin include acrylic, urethane, polyisobutylene, styrenebutadiene rubbers (SERs), rubber, polyvinylether, epoxy, melamine, polyester, phenol and silicone resins and copolymers thereof.

In particular, the adhesive layer 410 is preferably made of a material, which prevents permeation of moisture into the organic light emitting display device 200, and the material is preferably an acrylic or silicone resin having superior heat resistance.

In another case, the reactive liquid crystal layer 420 may be directly coated on one surface of the organic light emitting display panel 300 as shown in FIG. 5. In this case, an adhesive layer may be further disposed between the reactive liquid crystal layer and the NRT layer 430b.

Specifically, the reactive liquid crystal layer 420 includes an alignment layer and reactive liquid crystal. In example, the alignment layer is made of polyimide and the reactive liquid crystal is reactive mesogen. The reactive mesogen is an organic substance, which contains photopolymerization reactive groups at both ends of liquid crystal molecules, and the photopolymerization reactive groups are connected to one another, when ultraviolet light is irradiated thereto. Otherwise, the reactive liquid crystal layer 420 may be formed by coating mixed liquid material including polyimide and reactive mesogen directly on the organic light emitting panel 300 or the NRT layer 430b.

Herein, the reactive mesogen is self-aligned and is thus aligned in the same direction as the alignment direction of the alignment layer and the optical axis thereof is formed according to the alignment direction of the alignment layer.

The reactive liquid crystal layer 420 performs the same function as the circular polarization plate and converts light which is linearly polarized by the polarizing layer 440 into circularly polarized light, or converts the circularly polarized light into linearly polarized light.

The method for forming the reactive liquid crystal layer 420 according to one embodiment will be described below.

First, a reactive liquid crystal layer is arranged in a predetermined direction on the surface of the adhesive layer 410, and reactive mesogen is coated on the alignment layer. Since an optical axis of the reactive mesogen is formed depending on the alignment direction of the reactive liquid crystal layer, the alignment direction of the reactive liquid crystal layer preferably forms an angle of about +45° or −45° with the transmission axis of the polarizing layer 440. Then, UV light is irradiated to cure the coated reactive mesogen and thereby form a reactive liquid crystal layer 420.

The polarizing layer 440 is preferably made of polyvinyl alcohol (PVA) and the polarizer film 400 transmits exterior light parallel to the transmission axis and absorbs exterior light non-parallel to the transmission axis.

Accordingly, the exterior light incident upon the organic light emitting display device is linearly polarized in the transmission axis of the polarizing layer 440. In addition, the linearly polarized exterior light passes through the reactive liquid crystal layer 420 adhered to the bottom of the polarizing layer 440. The reactive liquid crystal layer 420 has an optical axis which forms an angle of about +45° or −45° with respect to a transmission axis of the polarizer layer 440, and exterior light is circularly polarized such that the vibrational direction thereof circularly moves.

In addition, the circularly polarized exterior light reflects on the surface of the organic light emitting display panel 300 and the rotational direction thereof is reversed. Then, the light passes through the reactive liquid crystal layer 420 and is then linearly polarized. At this time, the exterior light which passes through the reactive liquid crystal layer 420 and is then linearly polarized is perpendicular to the polarization side of linearly polarized light which does not pass through the reactive liquid crystal layer 420, and the linearly polarized exterior light thus forms 90° with the transmission axis of the polarizing layer 440. Accordingly, exterior light incident upon the organic light emitting display device is absorbed and blocked by the polarizing layer 440, since it does not pass through the polarizing layer 440 and is not emitted to the outside.

That is, since exterior light incident upon the organic light emitting display device is not emitted to the outside, reflection of exterior light is prevented using the antireflective member 400 and visibility of the organic light emitting display device can thus be improved. In addition, the organic light emitting display device of the present invention uses the reactive liquid crystal layer 420 may have a negative dispersion with respect to wavelength. In this case, the reactive liquid crystal layer may have a refractive index of red wavelength and blue wavelength smaller than that of green wavelength. Thus it prevents color transition at a high viewing angle. In particular, the reactive liquid crystal layer 420 is cheaper and thinner than the quarter wave plate, thus reducing manufacturing costs of the organic light emitting display device.

Otherwise, it is possible that the reactive liquid crystal layer may have a positive dispersion with respect to wavelength. In this case, the thickness of layers consisting of the antireflective member 400 may be differenciated from the case using the negative dispersion as the reactive liquid crystal layer.

Referring to FIGS. 6A and 6B, the position of exterior light is most preferably changed to $S_0$, $S_1$, $S_2$ and $S_3$ in this order, in order to minimize color transition and effectively prevent reflection of exterior light on the organic light emitting display device.

In this regard, as shown in FIG. 6A, in the organic light emitting display device of the related art, exterior light, which passes through the polarizer film and is then positioned at position ①, shifts to position ② after passing through the lower protective layer having a retardation value. Then, the light shifts from position ② to position ③ after passing through the quarter wave plate. Then, exterior light is reflected from the surface of the organic light emitting display device, passes through the quarter wave plate and is then shifted to position ④, and passes through the lower protective layer and is then shifted to position ⑤.

That is, the organic light emitting display device of the related art exhibits color transition and thus screen defects due to the lower protective layer having retardation value.

On the other hand, as shown in FIG. 6B, in the organic light emitting display device of the present invention, exterior light is remained while passing the NRT layers 430b at position ① S1 and the exterior light shifts from position ① S1 to position ② S2 after passing through the reactive liquid crystal layer 420. In addition, the exterior light is reflected from the surface of the organic light emitting display panel 300, shifts to position ③ S3 after passing through the reactive liquid crystal layer 420 and then remained at position ③ S3 while passing through the NRT layer 430b.

That is, the organic light emitting display device of the present invention is free of color transition of exterior light, when the light passes through the NRT layer 430b having no retardation value.

Furthermore, the reactive liquid crystal layer 420 is thinner than the quarter wave plate and is possible to direct coat on the organic light emitting display panel or the NRT layer. And it is possible to select a positive dispersion characteristic or a negative dispersion characteristic with respect to the wavelength as the reactive liquid crystal material. By selecting dispersion characteristic with respect to the wavelength to compensate color transition, it makes possible to prevent color transition.

Further, the antireflective member 400 is thin and slimness of the organic light emitting display device can thus be realized.

For example, the antireflective member of the organic light emitting display device of the related art includes a quarter wave plate, upper and lower adhesive layers adhered to the top and bottom of the quarter wave plate, a polarizer film, and upper and lower protective layers adhered to the top and bottom of the polarizer film and has a thickness of about 200 µm. However, the antireflective member 400 of the organic light emitting display device of the present invention includes the reactive liquid crystal layer 420, the adhesive layer 410 arranged under the reactive liquid crystal layer 420, the polarizing layer 440 and the protective layer 430a and the NRT layer 430b adhered to the top and bottom of the polarizing layer 440 and has a thickness of about 115 µm, which corresponds to about half the thickness of the antireflective member of the organic light emitting display device of the related art.

In addition, the antireflective member of the organic light emitting display device of the related art is thick and exhibits color transition, thus causing deterioration in anti-reflectivity of exterior light and allowing transmittance of about 8.5% of exterior light incident upon the organic light emitting display device. On the other hand, the antireflective member 400 of the organic light emitting display device of the present invention is thin and exhibits improved antireflectivity of exterior light, and allows transmittance of about 5.3% of exterior light incident upon the organic light emitting display device, thus improving visibility. Furthermore, the side visibility and permeability are improved through the NRT layer between the polarizer film and the reactive liquid crystal layer and the optical performance of the organic light emitting display device is thus improved.

As apparent from the foregoing, the organic light emitting display device of the present invention has the following effects.

First, the antireflective member adhered to an organic light emitting display panel is thin and slimness of the organic light emitting display device can thus be realized.

Second, by reducing the total thickness of antireflective member, ability of antireflection is enhanced and it makes possible to improve visibility Third, using a reactive liquid crystal layer, which is cheaper than a quarter wave plate and an NRT layer serving as a protective layer, thus reducing manufacturing costs of the organic light emitting display device.

Fourth, the organic light emitting display device is provided with the NRT layer between the polarizer film and the reactive liquid crystal layer, thus improving side visibility and thereby enhancing optical performance.

Fifth, when the organic light emitting display device is applied to an 3D display using a patterned retarder on the organic light emitting display, it make to enhance a visible viewing angle by shorting a focal distance since the thinner antireflective member is adhered to an organic light emitting display panel rather than using quarter wave plate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
    an organic light emitting display panel; and
    an antireflective member adhered to an outer surface of the organic light emitting display panel, the antireflective member consisting of
        a retardation layer comprising a reactive liquid crystal layer, and
        a polarizer film consisting of a polarization layer having a transmission axis, a upper protective layer and a lower protective layer adhered to the top and the bottom of the polarization layer, respectively,
    wherein the lower protective layer is a non-retardation triacetyl cellulose and is disposed between the polarization layer and the reactive liquid crystal layer, the retardation layer comprising the reactive liquid crystal layer having a λ/4 retardation with respect to a transmitted light of the polarizer film and being directly coated on and in contact with the lower protective layer of the non-retardation triacetyl cellulose, wherein the retardation layer is bonded to the lower protective layer of the polarizer film without using an adhesive layer,
    wherein the reactive crystal layer includes an alignment layer and reactive liquid crystal, the reactive liquid crystal is self-aligned in the same direction as an alignment direction of the alignment layer.

2. The device according to claim 1, wherein the reactive liquid crystal layer circularly polarizes light linearly polarized through the polarizer film.

3. The device according to claim 1, wherein the reactive liquid crystal layer linearly polarizes light circularly polarized through the organic light emitting display panel.

4. The device according to claim 1, wherein the alignment layer includes a polyimide and the reactive liquid crystal includes a reactive mesogen.

5. The device according to claim 1, wherein the reactive liquid crystal layer is directly coated on the organic light emitting display panel.

6. The device according to claim 1, wherein the reactive liquid crystal layer is directly coated on an outer surface of the lower protective layer.

7. The device according to claim 1, wherein the reactive liquid crystal layer has a negative dispersion with respect to wavelength.

8. The device according to claim 7, wherein the reactive liquid crystal layer has a refractive index of red wavelength and blue wavelength smaller than that of green wavelength.

9. The device according to claim 1, wherein the reactive liquid crystal layer has a positive dispersion with respect to wavelength.

10. The device according to claim 1, wherein an optical axis of the reactive liquid crystal layer has an angle of about +45° or −45° with respect to a transmission axis of the polarizer film.

11. The device according to claim 1, further comprising an adhesive layer between the polarizer film and the organic light emitting display panel.

12. The device according to claim 1, wherein the organic light emitting display panel comprises:
    a substrate;
    a thin film transistor array;
    an organic emitting element array connected to the thin film transistor array; and
    an encapsulation substrate to cover the thin film transistor array and the organic emitting element array.

* * * * *